United States Patent
Onódy et al.

(10) Patent No.: US 9,094,042 B2
(45) Date of Patent: Jul. 28, 2015

(54) DAC CURRENT SOURCE MATRIX PATTERNS WITH GRADIENT ERROR CANCELLATION

(71) Applicant: Silicon Laboratories Inc., Austin, TX (US)

(72) Inventors: Péter Onódy, Budapest (HU); Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/963,788

(22) Filed: Aug. 9, 2013

(65) Prior Publication Data

US 2015/0042498 A1    Feb. 12, 2015

(51) Int. Cl.
*H03M 1/66* (2006.01)

(52) U.S. Cl.
CPC .................................. *H03M 1/66* (2013.01)

(58) Field of Classification Search
CPC ..... H03M 1/747; H03M 1/682; H03M 1/745; H03M 1/742; H03M 1/66
USPC .................................................. 341/144, 120
See application file for complete search history.

(56) References Cited

U.S. PATENT DOCUMENTS

| | | | |
|---|---|---|---|
| 6,496,129 B2 * | 12/2002 | Dedic et al. | 341/144 |
| 7,026,967 B2 * | 4/2006 | Eloranta | 341/120 |
| 7,030,799 B2 * | 4/2006 | Lee et al. | 341/144 |
| 2003/0227402 A1 * | 12/2003 | Starzyk et al. | 341/144 |

OTHER PUBLICATIONS

Bastos, Jose et al. "A 12-Bit Intrinsic Accuracy High-Speed CMOS DAC,", IEEE Journal of Solid-State Circuits, vol. 33, No. 12, Dec. 1998, pp. 1959-1969.
Kuo, Ko-Chi and Wu, Chi-Wei, "A Switching Sequence for Linear Gradient Error Compensation in the DAC Design," IEEE Transactions on Circuits and Systems—II: Express Briefs, vol. 58, No. 8, Aug. 2011, pp. 502-506.
Lin, Chi-Hung and Bult, Klaas, "A 10-b, 500-MSample/s CMOS DAC in 0.6 mm2," IEEE Journal of Solid-State Circuits, vol. 33, No. 12, Dec. 1998, pp. 1948-1958.
Lin, Chi-Hung et al., "A 12 bit 2.9 GS/s DAC With 1M3 <-60 dBc Beyond 1 GHz in 65 nm CMOS," IEEE Journal of Solid-State Circuits, vol. 44, No. 12, Dec. 2009, pp. 3285-3293.

(Continued)

*Primary Examiner* — Jean B Jeanglaude
(74) *Attorney, Agent, or Firm* — Abel Law Group, LLP

(57) ABSTRACT

First order gradient errors are canceled with no current source splitting by placing consecutive current sources symmetrically around the center of the array. Consecutive elements that correspond to small input amplitudes (mid-scale codes) make a smaller spatial jump than those correspond to larger signal amplitudes. Both linear and second order gradients are reduced by splitting each current cell into two and placing sub-elements symmetrically with respect to the center of the array to address the linear gradient effect. To address second order gradients, current element placement follows a pattern such that consecutive element pairs are chosen with one of the pair being placed with respect to the zero error contour of the second order gradient so as to have a positive error and the second of the pair being placed so as to have a negative error resulting in reduced second order error accumulation.

21 Claims, 11 Drawing Sheets

(56) References Cited

OTHER PUBLICATIONS

Nakamura, Yasuyuki et al., "A 10-b 70-MS/s CMOS D/A Converter," IEEE Journal of Solid-State Circuits, vol. 26, No. 4, Apr. 1991, pp. 637-642.

Seo, Dongwon and McAllister, Gene, "A Low-Spurious Low-Power 12-bit 16—MS/s DAC in 90-nm CMOS for Baseband Wireless Transmitter," IEEE Journal of Solid-State Circuits, vol. 42, No. 3, Mar. 2007, pp. 486-495.

Van Der Plas, Geert A. et al., "A 14-bit Intrinsic Accuracy Q2 Random Walk CMOS DAC," IEEE Journal of Solid-State Circuits, vol. 34, No. 12, Dec. 1999, pp. 1708-1718.

* cited by examiner

| 2 | 3 | 6 | 7 | 10 | 11 | 14 | 62 |
|---|---|---|---|---|---|---|---|
| 49 | 48 | 45 | 44 | 41 | 40 | 15 | 59 |
| 52 | 24 | 25 | 28 | 29 | 37 | 18 | 58 |
| 53 | 21 | 34 | 63 | 32 | 36 | 18 | 58 |
| 56 | 20 | 35 | 31 | 64 | 33 | 22 | 54 |
| 57 | 17 | 38 | 30 | 27 | 26 | 23 | 51 |
| 60 | 16 | 39 | 42 | 43 | 46 | 47 | 50 |
| 61 | 13 | 12 | 9 | 8 | 5 | 4 | 1 |

FIG. 7A

| 3 | 2 | 61 | 60 | 57 | 56 | 53 | 52 |
|---|---|---|---|---|---|---|---|
| 6 | 39 | 24 | 21 | 20 | 17 | 49 | 16 |
| 7 | 42 | 38 | 35 | 34 | 30 | 48 | 13 |
| 10 | 43 | 25 | 63 | 31 | 27 | 45 | 12 |
| 11 | 46 | 28 | 32 | 64 | 26 | 44 | 9 |
| 57 | 47 | 29 | 33 | 36 | 37 | 41 | 8 |
| 15 | 50 | 18 | 19 | 22 | 23 | 40 | 5 |
| 51 | 54 | 55 | 58 | 59 | 62 | 1 | 4 |

FIG. 7B

| 8 | 54 | 10 | 52 | 12 | 50 | 14 | 63 |
|---|---|---|---|---|---|---|---|
| 56 | 19 | 43 | 21 | 41 | 23 | 48 | 1 |
| 6 | 45 | 28 | 34 | 30 | 39 | 16 | 61 |
| 58 | 17 | 36 | 32 | 31 | 25 | 46 | 3 |
| 4 | 47 | 26 | 33 | 64 | 37 | 18 | 59 |
| 60 | 15 | 38 | 29 | 35 | 27 | 44 | 5 |
| 2 | 49 | 24 | 40 | 22 | 42 | 20 | 57 |
| 62 | 13 | 51 | 11 | 53 | 9 | 55 | 7 |

FIG. 7C

| 2 | 3 | 6 | 7 | 10 | 11 | 14 | 63 |
|---|---|---|---|---|---|---|---|
| 50 | 49 | 46 | 45 | 42 | 41 | 15 | 60 |
| 53 | 24 | 25 | 28 | 29 | 38 | 18 | 59 |
| 54 | 21 | 35 | 32 | 64 | 37 | 19 | 56 |
| 57 | 20 | 36 | 31 | 33 | 34 | 22 | 55 |
| 58 | 17 | 39 | 30 | 27 | 26 | 23 | 52 |
| 61 | 16 | 40 | 43 | 44 | 47 | 48 | 51 |
| 62 | 13 | 12 | 9 | 8 | 5 | 4 | 1 |

FIG. 7D

| 2 | 4 | 6 | 8 | 10 | 12 | 14 | 63 |
|---|---|---|---|---|---|---|---|
| 50 | 48 | 46 | 44 | 42 | 40 | 16 | 61 |
| 52 | 23 | 25 | 27 | 29 | 38 | 18 | 59 |
| 54 | 21 | 35 | 64 | 31 | 36 | 20 | 57 |
| 56 | 19 | 37 | 32 | 33 | 34 | 22 | 55 |
| 58 | 17 | 39 | 30 | 28 | 26 | 24 | 53 |
| 60 | 15 | 41 | 43 | 45 | 47 | 49 | 51 |
| 62 | 13 | 11 | 9 | 7 | 5 | 3 | 1 |

FIG. 7E

Axis of zero 2nd order gradient

One dimensional 2nd order gradient

FIG.13

| 61 | 59 | 51 | 30 | 24 | 47 | 55 | 63 |
|---|---|---|---|---|---|---|---|
| 32 | 5 | 13 | 34 | 40 | 17 | 9 | 1 |
| 53 | 28 | 39 | 18 | 41 | 20 | 37 | 57 |
| 11 | 36 | 25 | 46 | 23 | 44 | 27 | 7 |
| 45 | 16 | 14 | 8 | 10 | 12 | 43 | 49 |
| 19 | 48 | 50 | 56 | 54 | 52 | 21 | 15 |
| 26 | 33 | 6 | 64 | 2 | 4 | 35 | 22 |
| 38 | 31 | 58 | 3 | 62 | 60 | 29 | 42 |
| 22 | 35 | 4 | 2 | 64 | 6 | 33 | 26 |
| 42 | 29 | 60 | 62 | 3 | 58 | 31 | 38 |
| 49 | 43 | 12 | 10 | 8 | 14 | 16 | 45 |
| 15 | 21 | 52 | 54 | 56 | 50 | 48 | 19 |
| 57 | 37 | 20 | 41 | 18 | 39 | 28 | 53 |
| 7 | 27 | 44 | 23 | 46 | 25 | 36 | 11 |
| 63 | 55 | 47 | 24 | 30 | 51 | 59 | 61 |
| 1 | 9 | 17 | 40 | 34 | 13 | 5 | 32 |

FIG. 14

DAC CURRENT SOURCE MATRIX PATTERNS WITH GRADIENT ERROR CANCELLATION

BACKGROUND

1. Field of the Invention

This invention relates to digital-to-analog converters (DACs) and more particularly to gradient error cancellation associated with digital-to-analog converters.

2. Description of the Related Art

One problem with DACs is that gradients in the integrated circuit due to, e.g., process or temperature can impact the accuracy of the DAC. For example, referring to FIG. 1A, a power amplifier 101 that generates heat adjacent to a DAC 102 in an integrated circuit 103 may cause a temperature gradient in the integrated circuit as shown in FIG. 1B. For simplicity, in the figure it is assumed that the temperature decreases linearly as distance from the heat source increases as illustrated by line 105. While a linear temperature gradient is shown, threshold voltage or other parameters may also increase or decrease across the device that can be approximated by a linear gradient (first order) or quadratic (second order) or even higher order gradients. Calibration of the DAC can be used to address such gradients, but such calibration typically requires complex circuitry and additional space that can be undesirable for certain DAC applications.

Therefore, it would be desirable to resolve gradient issues using device placement patterns and intrinsic device characteristics.

SUMMARY OF EMBODIMENTS OF THE INVENTION

In an embodiment, first order gradient errors are canceled with no current source splitting. Consecutive current sources are placed symmetrically around the center of the array such that consecutive elements cancel the accumulated mismatch. The element placement may also follow a constraint that the consecutive elements that correspond to small input amplitudes (mid-scale codes) make a smaller spatial jump than those that correspond to larger signal amplitudes.

In an embodiment a digital-to-analog converter (DAC) includes an array of current elements configured to supply current using thermometer decoding of a code corresponding to at least a portion of a digital signal to be converted. For a majority of current elements in the array, pairs of consecutive current elements of the array are placed substantially symmetrically around a center location in the array, such that for each of the pairs, a first and second current element are offset from the center of the array in a substantially equal and opposite direction. In an embodiment spatial separation for current elements of the pairs corresponding to codes for larger signal amplitudes is larger compared to spatial separation for the current elements of pairs corresponding to codes for smaller signal amplitudes.

In another embodiment a method of operating a digital to analog converter providing thermometer decoding using an array of current elements includes supplying a current in response to a code, the code corresponding to at least a portion of a digital signal to be converted. For a majority of pairs of consecutive current elements, error from a first current element of the pair is reduced in response to a second current element of each pair being turned on responsive to a minimum increment in the control code.

In another embodiment, in addition to linear gradient cancellation, quadratic gradient effects are also addressed. Each current cell element is split into two sub-elements, which are placed symmetrically with respect to the center of the array to address the linear gradient effect. The cancellation of the first order gradient is achieved independent of the location of the sub-elements. That allows placement of current element pairs such that second order gradient effects are reduced. To address second order gradients, current element placement follows a pattern such that consecutive element pairs are chosen with one of the pair being placed, e.g., at the outer portion of the array, so as to have an error of a first value and the other current element of the pair being placed to have an error of a second value that is approximately opposite the first value.

In another embodiment a digital-to-analog converter (DAC) includes an array of current elements configured to provide thermometer decoding of an input code, wherein for a majority of current elements in the array, pairs of consecutive current elements of the array are arranged with a first current element of each pair being placed with respect to a zero error contour of a second order gradient to have a positive error and a second current element of the pair is placed to have a negative error of approximately a same magnitude as the positive error. In an embodiment the current elements of the array include at least a first and a second sub-element, the first and second sub-element of each of the current elements being placed substantially symmetrically around the center of the array, such that the first sub-element and second sub-elements are offset in a substantially equal and opposite direction from the center of the array, thereby reducing first order gradient effects.

In another embodiment a method of operating a digital-to-analog converter (DAC) with a plurality of pairs of current elements includes turning on a first current element of each of the pairs responsive to respective input codes indicating an amount of current to supply from a thermometer decoding section of the DAC; and turning on a second current element of each of the pairs responsive to a thermometer code step responsive to an increment of the respective input codes. One of the pair of each of the current element pairs is located closer to a center of the current array and the second of the pair of each of the current element pairs located closer to an edge of the current array and thereby second order gradient effects of the first current element of each of the pairs is reduced by turning on the second current element of each of the pairs.

BRIEF DESCRIPTION OF THE DRAWINGS

The present invention may be better understood, and its numerous objects, features, and advantages made apparent to those skilled in the art by referencing the accompanying drawings.

FIGS. 7A-7E illustrate various examples of placement with linear gradient cancellation for an 8 by 8 matrix.

FIG. 13 shows an embodiment of a current array having placement of current elements to address first and second order gradient effects.

FIG. 14 shows an embodiment of a current array having placement of current elements to address first and second order gradient effects.

The use of the same reference symbols in different drawings indicates similar or identical items.

DETAILED DESCRIPTION

Figure 1A:
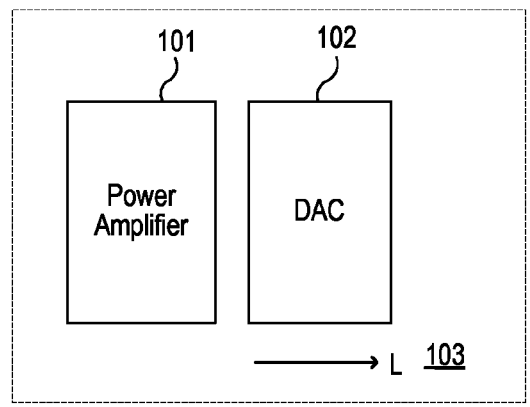
FIG. 1A illustrates a power amplifier 101 that generates heat adjacent to a digital to analog converter (DAC).
Figure 1B:
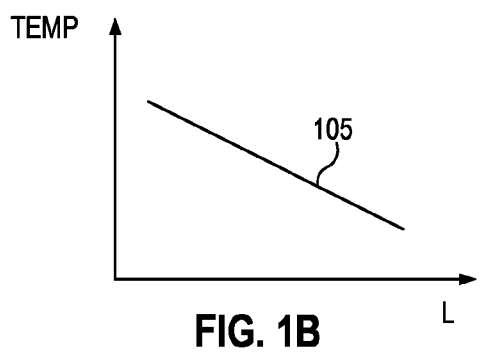
FIG. 1B illustrates a linear temperature gradient.
Figure 2:
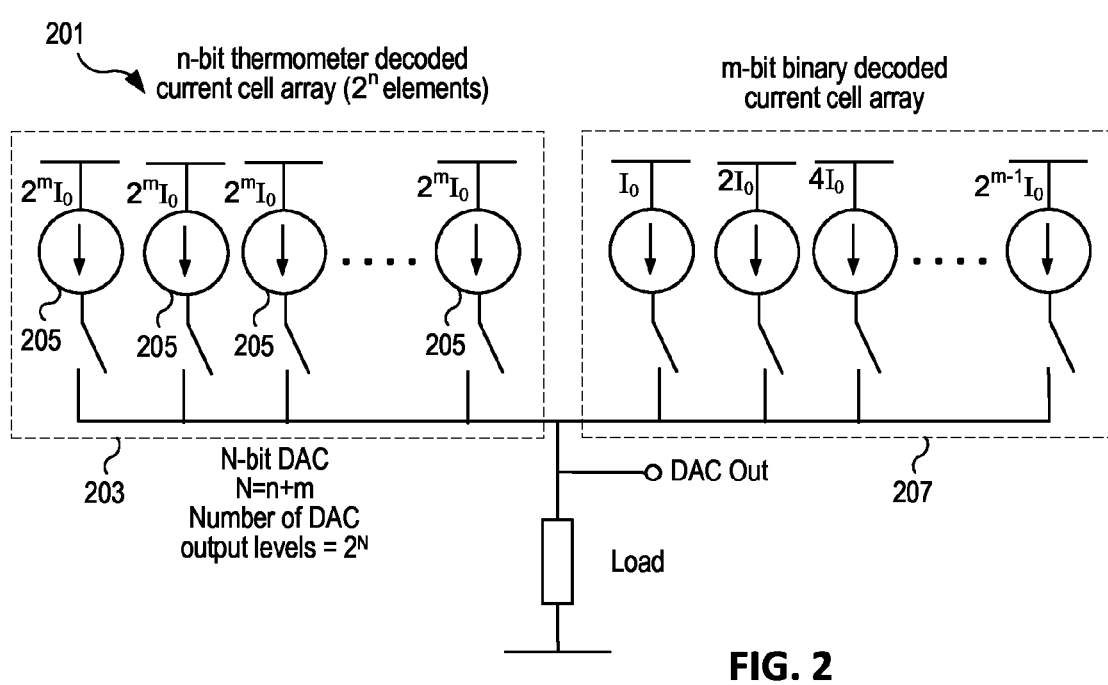
FIG. 2 illustrates a high level representation of a current steering DAC.

Current steering DACs are widely used in applications where high-speed (>100 Msample/s), mid-resolution (8-14 bit) DACs are needed. Typically, current steering DACS in such applications employ a segmented DAC topology. FIG. 2 is a high level representation of a current steering DAC that can utilize one or more embodiments described herein to address gradients. FIG. 2 illustrates a segmented current steering N-bit DAC (where N=n+m) where the n most significant bits (MSBs) are thermometer decoded in DAC portion 203 and the remaining m-LSBs are binary decoded in binary weighted current sources in DAC portion 207. The thermometer decoded portion of DAC 201 is formed of $2^n$ current sources or elements 205 that provide an equal current with a value equal to $2^m$ ($I_0$), where $I_0$ is the least-significant-bit. With thermometer decoding, for each additional minimum increment of the digital number to be converted by the thermometer decoding portion, an additional current element 205 is enabled. The digital number to be converted, also referred to herein as the code, determines which of the current sources supply current to the DAC output. Note that FIG. 2 is a high level conceptual representation of the DAC and each current source may be formed of one or more transistors whose gates are controlled to control the current flow as is well known in the art. The sum of the current from all the current sources 105 and the binary decoded portion 107 form the analog signal corresponding to the digital value to be converted.

Figure 3:
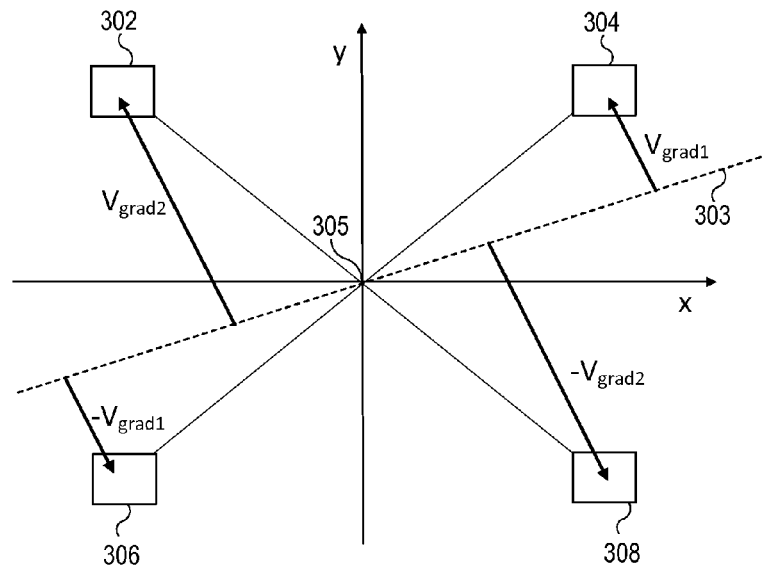
FIG. 3 illustrates how a four quadrant layout eliminates the effect of the linear gradient.

In high precision DACs the linear gradients on the wafer can significantly affect performance. Current steering DACs can employ gradient cancellation schemes in which each thermometer decoded device is placed in a current-cell array with patterns such that error accumulation due gradient effects are reduced. One gradient cancellation approach called hierarchical symmetrical switching, addresses only the linear gradient effects in one dimension. Another approach utilizes patterns that cancel a linear gradient in any direction. One such approach splits each current source element into smaller pieces (typically into four equal current sources) and places the four smaller current sources symmetrically in four quadrants to cancel error accumulation due to gradients. FIG. 3 illustrates how a four quadrant layout eliminates the effect of the linear gradient. In the 4 quadrant layout the current source devices are split into 4 devices. Note that actual current source devices can be implemented using single or cascoded metal oxide semiconductor (MOS) or bipolar junction transistors. For various embodiments discussed below MOS devices are assumed but other embodiments may utilize other types of devices. The current sources 302, 304, 306, and 308 represent the split current source MOS devices and their position in an array. The line 303 represents a reference gradient line. That is, each point on line 303 has zero gradient. The zero gradient line should cross the reference (0, 0) point at 305. The distance from the zero gradient line 303 defines the magnitude of the gradient. The magnitude and orientation of the gradient for each of the MOS devices 302, 304, 306, and 308 is represented by vectors having a magnitude of Vgrad1 and Vgrad2. It can be seen that the sum of 4 gradient vectors is zero, which results in the elimination of the gradient effect. Note that FIG. 3 illustrates a four quadrant approach but it can be seen that splitting a current source into two smaller devices, e.g., into 302 and 308, can be sufficient to eliminate a linear gradient effect. Fragmentation of the current sources, however, results in the need to use a larger silicon area and often results in unfavorable aspect ratios, dictated by matching and total DAC current requirements.

Figure 4:
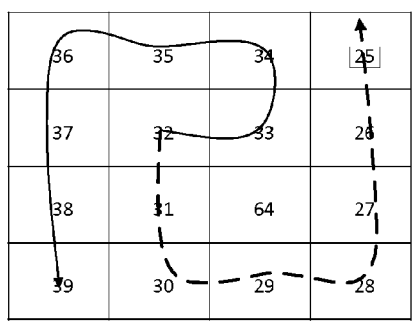
FIG. 4 illustrates spiral pattern placement of current elements in which elements corresponding to a large signal amplitude are placed farther from the center of the array and midscale current elements are placed closer to the center of the array.

In the four quadrant case shown in FIG. 3, the position of the MOS current elements can be defined more or less randomly. In an embodiment, the current elements that are switched at a low signal level are placed into the middle of the current array. The binary decoded portion of the DAC may also be placed in the middle of the current array. The other transistors forming the current elements are put around the center of the array in such a way that the MOS device corresponding to a large signal amplitude is placed farther from the center of the array. That placement allows the magnitude of the error caused by gradient effect to be more or less proportional with the signal level, and the relative error is constant. Such an approach results in a generally spiral pattern as can be seen in FIG. 4. In FIG. 4, current elements 32, 33, 31 and 64 form the center of the array. Current element 64 may correspond to the binary decoded portion of the DAC in which the current of element 64 is split into m binary weighted elements. Note that FIG. 4 shows only the middle of a 64 element matrix, where the middle code is related to 32 or (31, 32). The placement starts at the center of the array, element 32, and as the code corresponding to the current element and signal magnitude increases, the current elements get farther from the center of the array in a spiral-like pattern. Similarly, as the code decreases, the lower codes, corresponding to larger negative signal amplitudes, get farther from the center of the array. The spiral placement may not sufficiently reduce the gradient effect, and if better cancellation of gradient effects is needed, the spiral placement can be combined with gradient cancelling as described further herein. Note that total elimination of the gradient effect may not be required, because the MOS transistors always have mismatch error so the goal may be to ensure that the gradient effect is much lower than mismatch error.

Figure 5:
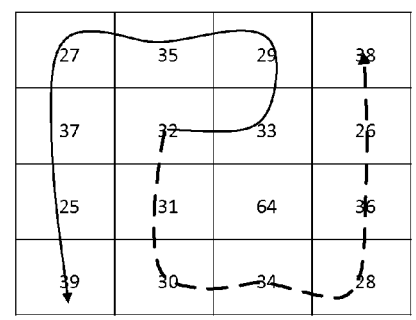
FIG. 5 illustrates a transformation of the current array of FIG. 4 into a gradient canceling array by swapping elements to eliminate the accumulation of error.
Figure 6:
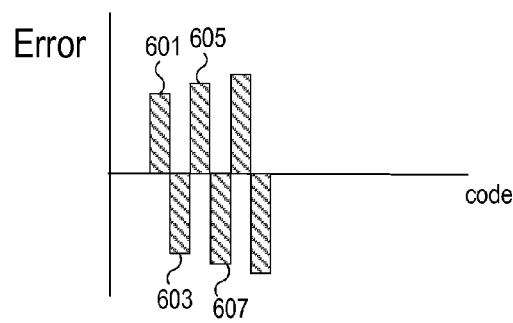
FIG. 6 illustrates how accumulation of error is eliminated in the embodiment of FIG. 5.

Cancellation in conjunction with the spiral pattern can be achieved by placing every second element on a side opposite to its original position. Referring to FIG. 5, the spiral placement of the current array of FIG. 4 is transformed into the gradient canceling array of FIG. 5 by swapping elements, e.g. 29 and 34, 27 and 36, 25 and 38. That way the integral nonlinearity (INL) is zero for every second thermometer code step, not zero for all codes, but the accumulation of the error is eliminated. The INL can be kept below a certain low level even if there is huge gradient. FIG. 6 illustrates the idea of error cancellation achieved by swapping elements. Assume the error accumulated with a code in which element 25 is the last one turned on is illustrated in FIG. 6 by 601. If the code increases by a minimum increment then element 26 turns on which has an error represented by 603. That error is equal and opposite of the error caused by element 25 and thus cancels the accumulated error. The same occurs if the code decreases by a minimum amount. The magnitude of the errors increases as the current elements get farther from the center of the array (the zero gradient location). Thus, errors 605 and 607 represent the error contributed by elements 38 and 39 respectively, and when both current elements are on, the errors contributed by the two current elements cancel.

FIGS. 7A-7E illustrate various examples of placement with gradient cancellation for an 8 by 8 matrix. Remember that in a particular embodiment the goal may be to reduce the gradient effect below a certain level, typically a level dictated by the intrinsic device matching characteristics, rather than maximize cancellation of the gradient effect. Thus, for reasons of layout ease, or other design considerations, although the majority of adjacent current elements pairs may be placed so as to cancel errors, not every element pair necessarily has to be placed symmetrically with respect to a center of the array.

FIG. 7A illustrates a first example of an 8×8 array. The code to control this array is a 6-bit binary code that goes through a 6-to-64 binary-to-thermometer decoder providing for 0 to 63 of the current elements being turned on based on the code value. For each minimum increment in the code, e.g., from 11 to 12, an additional current element is turned on to supply current. FIG. 7A shows pairs of consecutive current elements (e.g., current elements 1 and 2, current elements 35 and 36) arranged symmetrically around the center of the current array. The spiral pattern can be seen as the current elements get farther from mid-scale code values. FIG. 7B illustrates another embodiment in which pairs of consecutive current elements (e.g., current elements 27 and 28) are arranged symmetrically around the center of the current array. FIG. 7C illustrates another embodiment in which pairs of consecutive current elements (e.g., current elements 25 and 26) are arranged symmetrically around the center of the current array. FIG. 7D illustrates another embodiment in which pairs of consecutive current elements (e.g., current elements 36 and 37) are arranged symmetrically around the center of the current array. FIG. 7E illustrates another embodiment in which pairs of consecutive current elements (e.g., current elements 36 and 37) are arranged symmetrically around the center of the current array.

One advantage of the placement approach illustrated in FIGS. 5 and 7A-7E, is that the placement approach does not require splitting the current source MOS transistors into 2 or 4 pieces. Splitting the transistor usually results undesirable width/length (W/L) ratios. For example, splitting the transistor into four equal current sources as in the four quadrant cancellation scheme (see FIG. 3) results in the width changing to W=Wo/4, where Wo is original width of MOS device. Device matching is set mainly by the device area WL where W and L are the width and the length of the transistor, respectively, and the W/L ratio, which sets the gate overdrive voltage (gate-to-source voltage $V_{GS}$, minus the threshold voltage $V_T$). Explicitly, the current mismatch due to threshold mismatch is proportional to $(V_{GS}-V_T)/\sqrt{WL}$. Assuming an original J×K (e.g., 8×8) array having a square like aspect ratio, once the individual current sources are split into four the array aspect ratio becomes more like 4-to-1 if the same J×K arrangement is kept. Of course the array can be arranged differently (e.g., 4×16) to make the aspect ratio more favorable but such arrangements typically result in less effective gradient cancellation schemes. The various dimensions depend on the technology and the bias point of the MOS devices. Also the overhead (e.g. space between devices) of the four quadrant splitting approach can significantly increase the area.

Figure 8A:
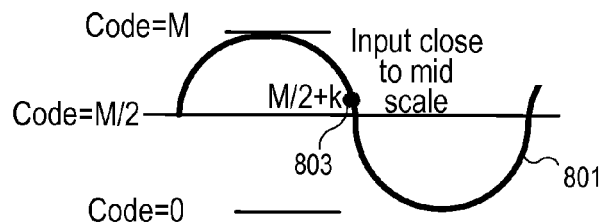
FIG. 8A illustrates possible values of a code for a sinusoidal input signal and in particular a midscale code value.
Figure 8B:
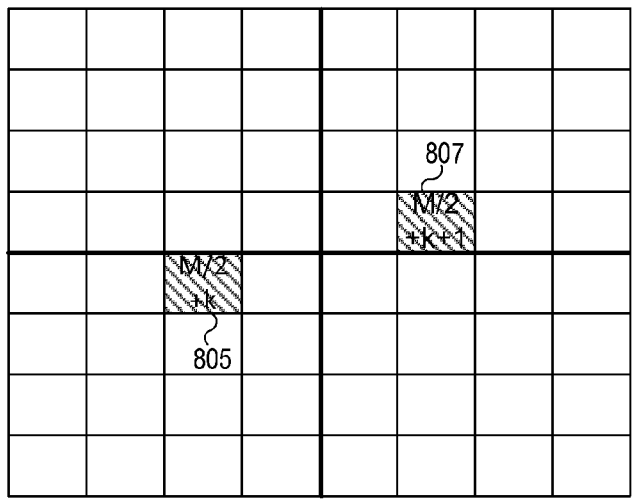
FIG. 8B illustrates placement of the current element for the midscale code value, which corresponds to a small signal amplitude.

In the embodiments illustrated in FIGS. 7A-7E, the element placement also follows a constraint that pairs of consecutive elements corresponding to small input amplitudes (mid-scale codes) have a smaller spatial separation than those corresponding to larger signal amplitudes, which provides a spurious free dynamic range (SFDR) that is relatively constant across input signal amplitudes. That is, gradient errors associated with small signal values are small because the current elements are located close to the zero error location (the center of the array). When a sinusoidal signal is applied, low amplitude signals correspond to middle thermometer codes. For example, for a 64 element thermometer code, the elements around element 32 correspond to small signal amplitudes. Referring to FIGS. 8A and 8B assume a differential current steering DAC with a maximum code of M and a minimum code of 0. The waveform 801 shows possible values of the code. The largest signal amplitudes are for the codes of M and 0 corresponding to the most positive and negative differential values. When the code value M/2+k is close to M/2 (k is small), which corresponds to a small signal amplitude, then the current element 805 (FIG. 8B) is located close to the center of the array. The current element 807 corresponding to the next element paired with current element 805 is positioned symmetrically with respect to the center of the current array. Because the current elements are close to each other and the center of the array, the errors associated with the current elements are small along with the signal amplitude corresponding to the elements.

Figure 9A:
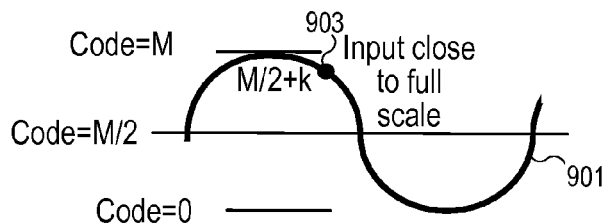
FIG. 9A illustrates possible values of a code for a sinusoidal input signal and in particular a code value near full scale.
Figure 9B:
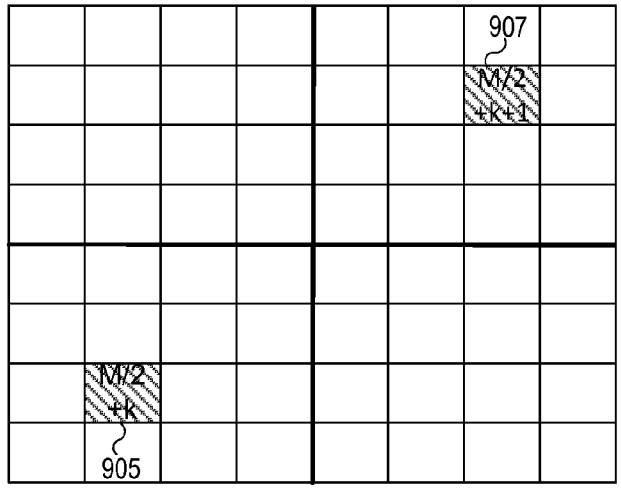
FIG. 9B illustrates placement of the current element for the near full scale code value, which corresponds to a large signal amplitude.

Referring to FIGS. 9A and 9B, assume a differential current steering DAC with a maximum code to decode of M and a minimum code of 0. The waveform 901 shows possible values of the code. When a sinusoidal signal is applied, when the code value M/2+k is far from M/2 (k is large) then the current element 905 (FIG. 9B) is positioned far from the center of the array (as compared to current element 805 shown in FIG. 8B). The current element 907 corresponding to the next element paired with current element 905 is positioned symmetrically with respect to the center. Because the current elements are farther from each other and the center of the array, the errors associated with the current elements are larger than for elements 805 and 807 of FIG. 8B but the larger errors correspond to larger signal amplitude. Having larger errors correspond to larger signal amplitudes and smaller errors correspond to smaller signal amplitudes provides a spurious free dynamic range (SFDR) that is relatively constant across input signal amplitudes.

Figure 10:
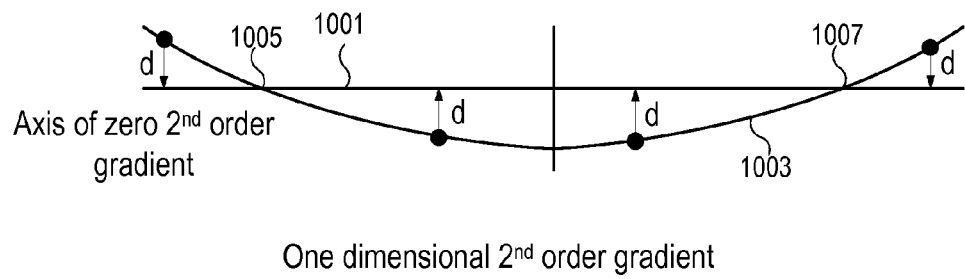
FIG. 10 illustrates an example of a one dimensional second order gradient.
Figure 11:
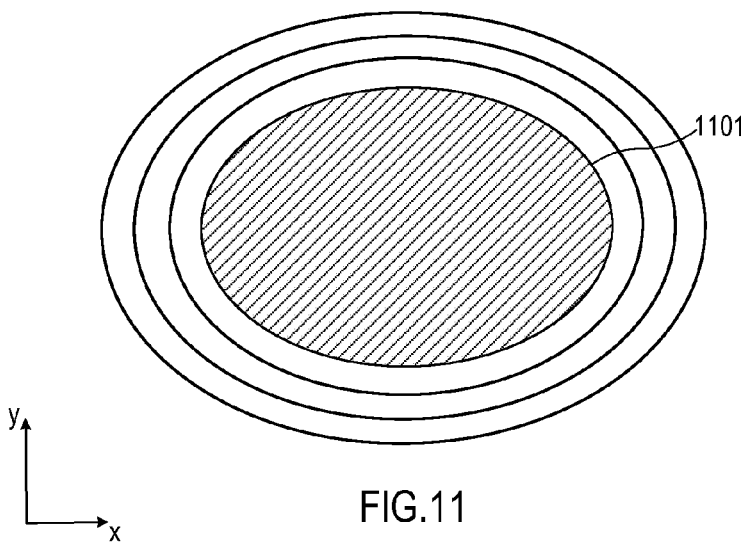
FIG. 11 represents another view of a second order gradient.
Figure 12:
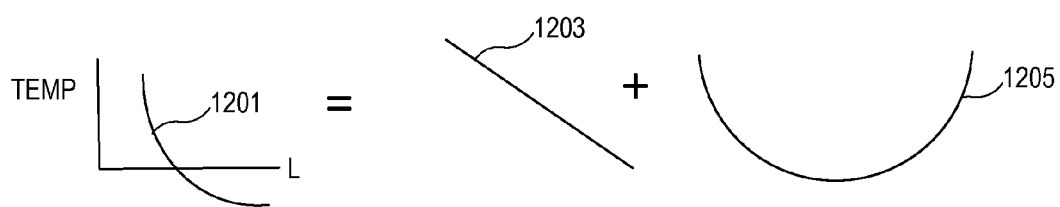
FIG. 12 illustrates how a temperature curve can be broken down into a linear portion and second order portion.

Another embodiment addresses both linear gradients and second order gradient effects using intrinsic device characteristics. FIG. 10 illustrates an example of a one dimensional second order gradient. The line 1001 represents the axis of zero second order gradient. The curve 1003 represents the errors as the array is traversed. The distance "d" represents the magnitude of the error at a particular point along curve 1003. Note that the zero error point in the example of FIG. 10 is not in the center of the array. Rather, the zero error is at 1005 and 1007 at either end of the array. FIG. 11 represents another view of a second order gradient (e.g., $z=1.5x^2+y^2$) in which 1101 represents the zero second order contour. The concentric rings outside 1101 represents increasing temperatures with increasing distance. Similarly, the shaded area encircled by 1101 indicates decreasing temperatures with minimum temperature being at the center. FIG. 12 represents how a temperature curve 1201 (or other parameter) can be broken down into a linear portion 1203 plus a quadratic (second order) portion 1205.

In an embodiment that addresses both linear and second order gradient effects, each current element is split into two sub-elements and placed symmetrically with respect to the center of the array. The sub-elements are both turned on when a code corresponding to the current element is on. The splitting of the current element virtually eliminates the linear gradient effect. That cancellation is independent of the location of the split current elements. That is, the sub-elements can be placed close to or far from the center of the array and still achieve cancellation of first order effects. While some embodiments herein contemplate splitting the current elements into two, other embodiments may use the quadrature approach of FIG. 3. By eliminating the linear gradient effect without limitations on placement of the sub-elements (other than for cancellation) allows placement of current elements such that second order gradient effects can also be reduced. In an embodiment, in order to address second order gradient effects, placement of current elements follows a pattern such that consecutive element pairs are chosen one from the outer portion of the array followed by one from closer to center resulting in reduced second order error accumulation.

Figure 13:
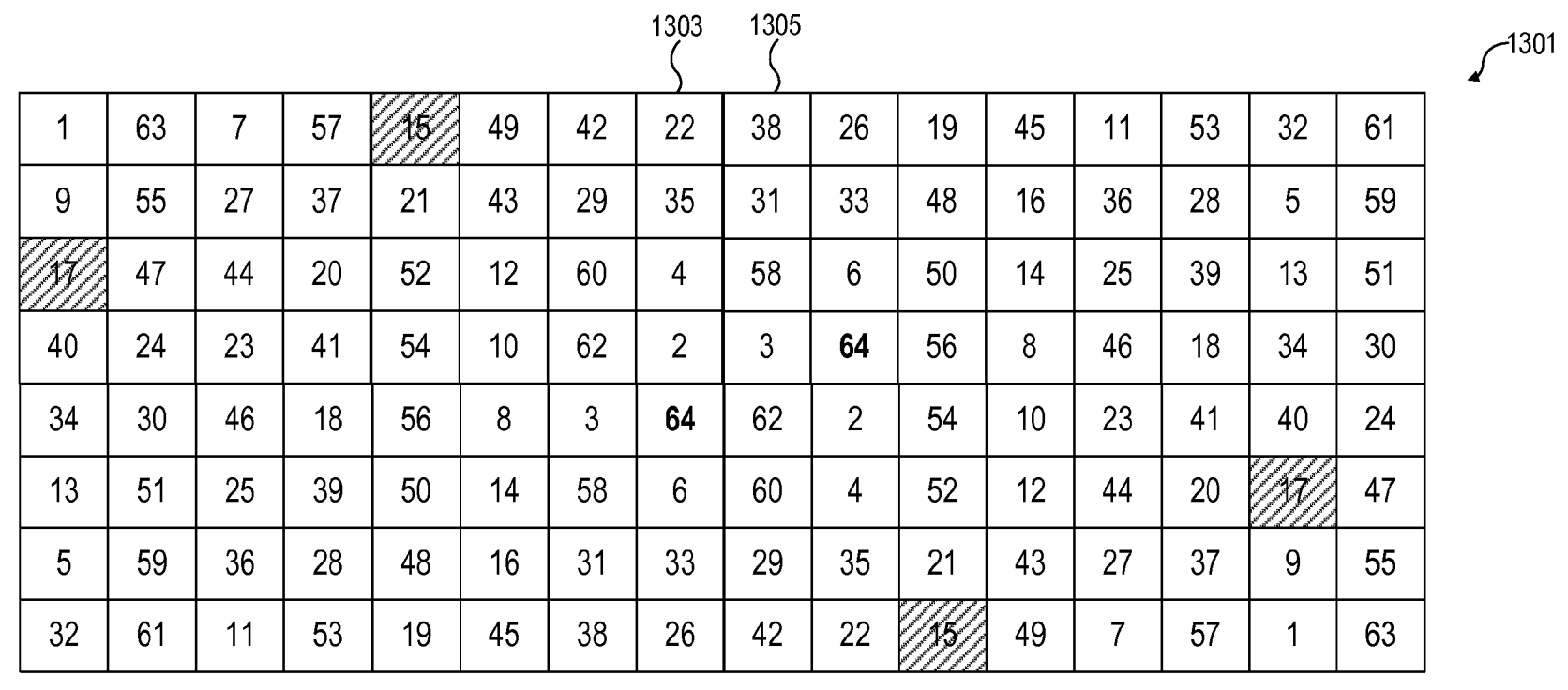
Figure 15:
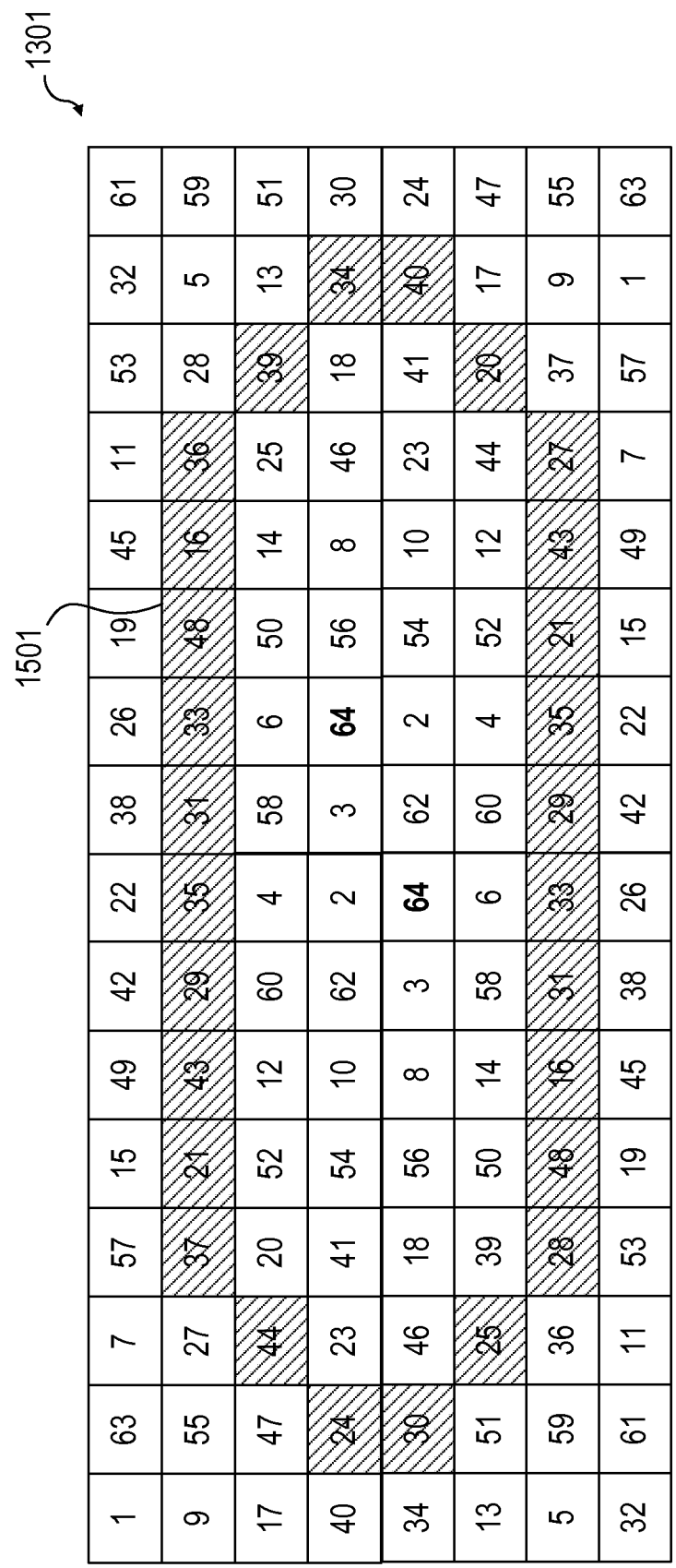
FIG. 15 illustrates the zero second order gradient contour in an embodiment.

FIGS. 13-15 show an embodiment of a current array having placement of current elements to address first and second order gradient effects. FIG. 13 illustrates how the current array 1301 addresses linear gradient effects by splitting current elements into sub-elements and arranging them symmetrically such that the error magnitude is substantially equal and opposite. For example, current elements 17 and 15 are split into two sub-elements and placed symmetrically around the center of the current array. Note that the sub-elements 15 and 17 are centered around the middle of column 1303 of the array. Other sub-elements, e.g., sub elements 4 are centered around the array column 1305. The center of mass toggles across two center cells as the code increases with no accumulation of error. Thus, while there may not be perfect linear error cancellation for every code, the linear error is small and does not accumulate.

FIG. 14 illustrates how the current array 1301 addresses second order gradient effects. Several element pairs are highlighted with cross hatching to illustrate the approach. Consecutive element pairs, e.g., element pairs (4, 5) are placed with one of the pair (4) being placed closer to the center of the array, followed by the other one of the pair (5) being placed farther from the center of the array. Similarly, element pairs (6,7) and (8,9) are similarly placed with one of the pair closer to the center and the other of the pair farther from the center resulting in reduced second order error accumulation. In embodiments, it may also beneficial to have the codes corresponding to low signal amplitudes (mid-scale codes) be located close to the zero second order gradient contour so that the signal to distortion ratio is relatively constant. The second order gradient embodiments described herein address more general shapes than just a simple circular gradient ($x^2+y^2$). Particular emphasis on $x^2$ or $y^2$ type gradients can arise in cases where there are large non-uniform structures are adjacent to the DAC, e.g., a chip boundary, or a high-current driver that can cause a temperature gradient.

In one dimension, the second order gradient has a parabolic shape (see FIG. 10). As shown in FIG. 10, the maximum of the gradient is located at both ends and the minimum is located at the middle. Therefore the average value is located at two sides of the center close to the both ends. See line 1001 crossing line 1003 at points 1005 and 1007. Similarly, in two dimensional arrays, the $2^{nd}$ order gradient has a "bowl" type shape with minimum at the center and maximum at the edges. The average value contour resides somewhere between center and the edges. See, e.g., contour 1101 in FIG. 11. In FIG. 11, the contour 1101 is assumed to have zero error. FIG. 15 illustrates the zero second order gradient contour for the current array 1301. The cross hatched elements represent the zero second order gradient contour 1501 in the illustrated embodiment and elements not cross hatched have either positive or negative error values. In FIG. 15, the values on the contour are close to code 32 (mid code) 32+/−10 except for a few elements (e.g., elements 16 and 48). The cells inside contour 1501 have negative error values whereas cells outside contour have positive errors. When selecting two consecutive cells, one element is selected outside the zero second order gradient contour 1501 that has an error (+E) and the second of the two consecutive elements is inside 1501 and has an error close to −E. Therefore the sum of two errors does not accumulate (+E−E=0). For mid-codes the goal is to pick elements spatially close on both sides of contour 1101 so that +E and −E have smaller values compared to the ones selected from the outer edge followed by center. Thus, the arrangement with one current element close to the center of the array and one element far, results in reduced second order gradients for a second order gradient as illustrated in FIG. 15. For second order gradients of other shapes, the approach is the same in that for mid-scale codes elements are placed close to the zero second order gradient error contour. In addition consecutive elements are placed so that the first element of the pair has a second order error (+E) and the second of the pair to has an error close to −E. Note that the gradients and contours can be determined by modeling the circuits as is known in the art.

Figure 17:
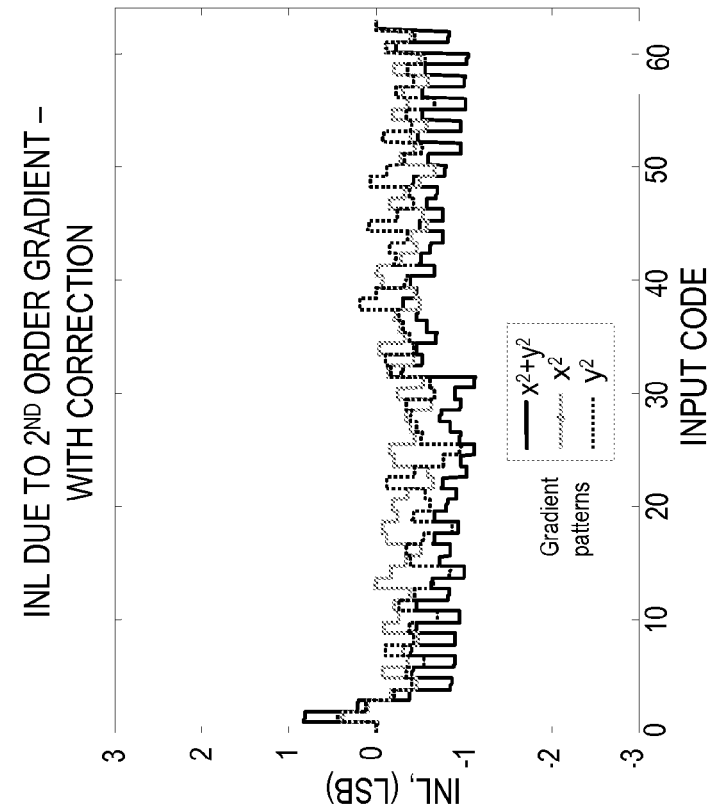
FIG. 17 illustrates INL versus input code for second order gradients with second order cancellation applied.
Figure 16:
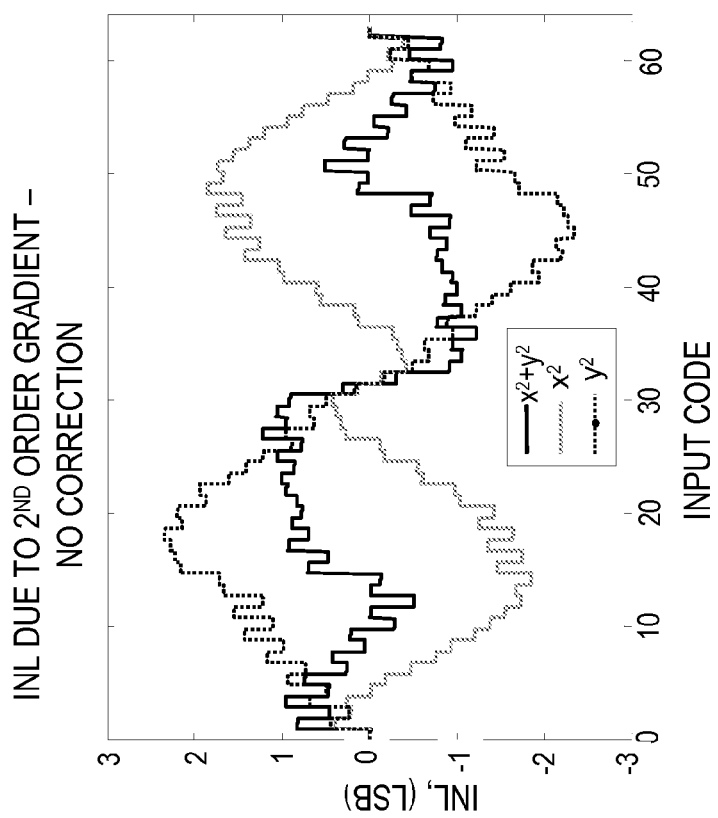
FIG. 16 illustrates INL versus input code for second order gradients without second order cancellation.

FIGS. 16 and 17 illustrate the effectiveness of second order gradient cancellation. FIG. 16 illustrates integral nonlinearity (INL) versus input code when no second order cancellation is applied. INL provides a measure of linearity of the DAC. Compare FIG. 17, which shows INL versus input code for three different gradient patterns for an 8×8 thermometer decoded current array when second order gradient cancellation is applied in accordance with the description herein. As can be seen, significant improvement is achieved using the second order techniques described herein. FIG. 17 illustrates the effectiveness of the scheme in the sense that the error is not accumulating for different second order gradient patterns.

In an embodiment the DAC is employed in the intermediate frequency (IF) output section of a television tuner chip. Meeting the spurious free dynamic range (SFDR) requirement is particularly challenging for analog tuners where spurs larger than −65 dBc generated from intermodulation of picture and sound carriers are undesirable for the quality of analog TV reception. Thus, various embodiments described herein can help address meeting SFDR requirements in such applications.

The description of the invention set forth herein is illustrative, and is not intended to limit the scope of the invention as set forth in the following claims. For example, while various examples used herein have assumed MOS devices, the cancellation techniques herein are also applicable when the current arrays are formed of bipolar junction transistors. Other variations and modifications of the embodiments disclosed herein, may be made based on the description set forth herein, without departing from the scope of the invention as set forth in the following claims.

What is claimed is:

1. A digital-to-analog converter (DAC) comprising:
an array of current elements configured to supply current using thermometer decoding of a code corresponding to at least a portion of a digital signal to be converted;
wherein for a majority of current elements in the array, pairs of consecutive current elements of the array are placed substantially symmetrically around a center of the array, such that for each of the pairs, a first and second current element are offset from the center of the array in a substantially equal and opposite direction.

2. The DAC as recited in claim 1 wherein the center of the array is a two dimensional center of the array.

3. The DAC as recited in claim 1 wherein spatial separation for current elements of the pairs corresponding to codes for larger signal amplitudes is larger compared to spatial separation for the current elements of pairs corresponding to codes for smaller signal amplitudes.

4. The DAC as recited in claim 3 wherein the smaller signal amplitudes are for mid-scale codes.

5. The DAC as recited in claim 3 wherein the DAC is a differential or single-ended current steering DAC.

6. The DAC as recited in claim 3 wherein the spurious free dynamic range is substantially constant across input signal amplitudes.

7. The DAC as recited in claim 1 wherein the current elements are metal oxide semiconductor (MOS) transistors or bipolar junction transistors.

8. The DAC as recited in claim 1 wherein the current elements are not split into sub-elements.

9. The DAC as recited in claim 1 wherein current elements of the pairs corresponding to codes for larger signal amplitudes are farther from the center of the array as compared to current elements of the pairs corresponding to codes for smaller signal amplitudes.

10. The DAC as recited in claim 1 wherein for each of the pairs of consecutive current elements, a first current element of the pair is turned off in response to a minimum decrement of a current value of the control code and a second current element is turned on in response to a minimum increment of the current value of the control code.

11. A method of operating a digital to analog converter providing thermometer decoding using an array of current elements, comprising:
in response to a digital control code, turning on a first current element offset from a center of the array and supplying a first current corresponding to the digital control code generated in part using the first current element;
responsive to a minimum increment to the digital control code, turning on a second current element, offset from the center of the array in a substantially equal and opposite direction as the first current element, as part of generating a second current corresponding to the digital control code with the minimum increment.

12. A digital-to-analog converter (DAC) comprising:
an array of current elements configured to provide thermometer decoding of an input code, wherein for a majority of current elements in the array, pairs of consecutive current elements of the array are arranged with a first current element of each pair being placed with respect to a zero error contour of a second order gradient to have a positive error and a second current element of the pair is placed to have a negative error of approximately a same magnitude as the positive error.

13. The digital-to-analog converter as recited in claim 12 wherein for a majority of current elements in the array, pairs of consecutive current elements of the array are arranged with one current element of each pair being placed closer to a center of the array and the other current element of each pair being placed closer to an outer portion of the array to thereby provide the positive error and the negative error.

14. The digital-to-analog converter as recited in claim 12 wherein the current elements of the array comprise:
at least a first and a second sub-element, the first and second sub-element of each of the current elements being placed substantially symmetrically around the center of the array, such that the first sub-element and second sub-elements are offset in a substantially equal and opposite direction from the center of the array.

15. The digital-to-analog converter as recited in claim 12 wherein a majority of mid-scale codes are placed at or near the zero error contour.

16. The digital-to-analog converter as recited in claim 12 wherein the digital-to-analog converter is a single-ended or differential current steering DAC.

17. The digital-to-analog converter as recited in claim 12 wherein the spurious free dynamic range is substantially constant across input signal amplitudes.

18. The DAC as recited in claim 12 wherein the current elements are one of metal oxide semiconductor (MOS) transistors or bipolar junction transistors.

19. A method of operating a digital-to-analog converter (DAC) with a plurality of pairs of current elements:
turning on a first current element of each of the pairs responsive to respective input codes indicating an amount of current to supply from a thermometer decoding section of the DAC; and
turning on a second current element of each of the pairs responsive to a thermometer code step responsive to an increment of the respective input codes, wherein one of the first and second current elements is located inside of a zero error contour of a second order gradient and another of the first and second current elements is located outside the zero error contour such that turning on the second current element offsets second order gradient effects associated with turning on the first current element.

20. The method as recited in claim 19 further comprising:
turning on the current elements by turning on at least two respective sub-elements forming each current element, the sub-elements disposed substantially symmetrically around a center location in an array of the current elements, and thereby substantially cancelling first order gradient errors associated with the current elements.

21. The method as recited in claim 19 wherein one of the pair of each of the current element pairs is located closer to a center of an array of the current elements and the second of the pair of each of the current element pairs located closer to an edge of the array.

* * * * *